US012153071B2

(12) United States Patent
Tsujimoto et al.

(10) Patent No.: US 12,153,071 B2
(45) Date of Patent: Nov. 26, 2024

(54) CURRENT SENSOR (71) Applicant: Asahi Kasei Microdevices Corporation, Tokyo (JP)

(72) Inventors: Masaki Tsujimoto, Tokyo (JP); Takuya Ishida, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 18/395,663

(22) Filed: Dec. 25, 2023

(65) Prior Publication Data

US 2024/0133923 A1 Apr. 25, 2024
US 2024/0230723 A9 Jul. 11, 2024

Related U.S. Application Data

(63) Continuation of application No. 18/449,702, filed on Aug. 14, 2023, now Pat. No. 11,867,728.

(30) Foreign Application Priority Data

Oct. 24, 2022 (JP) ................................. 2022-169617

(51) Int. Cl.
*G01R 15/20* (2006.01)
*G01R 19/00* (2006.01)
(Continued)

(52) U.S. Cl.
CPC ......... *G01R 15/20* (2013.01); *G01R 19/0092* (2013.01)

(58) Field of Classification Search
CPC ........ G01R 15/20; G01R 33/00; G01R 33/07; G01R 33/09; G01R 19/00
See application file for complete search history.

(56) References Cited

U.S. PATENT DOCUMENTS 10,101,368 B2 * 10/2018 Koiwa ................. G01R 15/207
2014/0151697 A1 * 6/2014 Ausserlechner ........ H01L 21/50
438/123
(Continued)

FOREIGN PATENT DOCUMENTS

JP 2010178490 A 8/2010
JP 2015190930 A 11/2015
(Continued)

OTHER PUBLICATIONS

Those references were submitted as IDS or found by the examiner over the earlier U.S. Appl. No. 18/449,702, filed Aug. 14, 2023.

*Primary Examiner* — Neel D Shah (57) ABSTRACT

A current sensor is configured by at least one magnetoelectric conversion element, a conductor, and a signal processing IC being encapsulated by an encapsulating portion. The current sensor includes a pair of first lead terminals that is partially exposed outside of the encapsulating portion, is electrically connected to the conductor, inputs the measurement current to the conductor, and outputs the measurement current from the conductor; a metal member that is partially exposed outside the encapsulating portion and is spaced apart from the conductor; and a supporting portion that supports the at least one magnetoelectric conversion element, the signal processing IC, and the metal member on a first surface, is separated from the conductor, and is separate from the metal member.

13 Claims, 8 Drawing Sheets

(51) Int. Cl.
  *G01R 33/00* (2006.01)
  *G01R 33/07* (2006.01)
  *G01R 33/09* (2006.01)

(56) References Cited

U.S. PATENT DOCUMENTS

| | | |
|---|---|---|
| 2014/0167736 A1 | 6/2014 | Suzuki |
| 2016/0187388 A1 | 6/2016 | Suzuki |
| 2016/0223594 A1 | 8/2016 | Suzuki |
| 2018/0156845 A1 | 6/2018 | Suzuki |

FOREIGN PATENT DOCUMENTS

| | | |
|---|---|---|
| JP | 6017182 B2 | 10/2016 |
| JP | 2018036237 A | 3/2018 |
| JP | 2018116047 A | 7/2018 |
| WO | 2013008462 A1 | 1/2013 |
| WO | 2014203862 A2 | 12/2014 |
| WO | 2015033541 A1 | 3/2015 |

* cited by examiner

CURRENT SENSOR

CROSS-REFERENCE TO RELATED APPLICATIONS

This application is a continuation of U.S. patent application Ser. No. 18/449,702, filed on Aug. 14, 2023, the entire contents of which are explicitly incorporated herein by reference. The application also claims priority from the following Japanese patent application, which is explicitly incorporated herein by reference:

N. 2022-169617 filed in JP on Oct. 24, 2022

BACKGROUND

1. Technical Field

The present invention relates to a current sensor.

2. Related Art

Patent Document 1 and Patent Document 2 disclose a current sensor having a magnetoelectric conversion element.

PRIOR ART DOCUMENTS

Patent Documents

Patent Document 1: Japanese Patent No. 6415148
Patent Document 2: Japanese Patent No. 6017182

DESCRIPTION OF EXEMPLARY EMBODIMENTS

Hereinafter, the present invention will be described through embodiments of the invention. However, the following embodiments are not for limiting the invention according to the scope of claims. In addition, not all of the combinations of features described in the embodiments are imperative to the solving means of the invention.

A current sensor includes a primary conductor through which a measurement current to be measured flows, a magnetoelectric conversion element that detects a magnetic field generated by the measurement current, and a signal processing IC that amplifies a signal from the magnetoelectric conversion element and outputs it outside, and the primary conductor, magnetoelectric conversion element, and signal processing IC are provided as one semiconductor package by encapsulating them with resin.

For example, Patent Document 1 discloses a current sensor including a primary conductor with a U-shape, a magnetoelectric conversion element arranged at an opening of the primary conductor, and a signal processing IC. An insulating member supporting the magnetoelectric conversion element is arranged such that it is in contact with a bottom surface of a supporting portion that supports the signal processing IC, without being in contact with the primary conductor.

In addition, Patent Document 2 also discloses a current sensor including a primary conductor with a U-shape, a magnetoelectric conversion element arranged in an opening of the primary conductor, and a signal processing IC. An insulating member supporting the magnetoelectric conversion element is arranged such that it is in contact with a back surface of the primary conductor.

In the current sensors according to Patent Document 1 and Patent Document 2, an IC supporting portion that supports the signal processing IC is configured by the same metal member as a signal terminal that is a secondary side lead terminal. However, when the metal member having high stiffness is used for the IC supporting portion, more thermal stress is generated by temperature change in the usage environment. In particular, the current sensor may pass a large current to the primary conductor, and due to high heat generation within the package, temperature change easily occurs on a daily basis, and there is a concern that the signal processing IC may crack.

With respect to the above mentioned concern, a measure can be taken to some extent by increasing the thickness of the signal processing IC. However, in Patent Document 1 and Patent Document 2, the IC supporting portion is a metal member having the same thickness as the signal terminal, and the signal processing IC is arranged on one side of the IC supporting portion. When the same lead frame as the primary conductor is used, the thickness of the signal terminal being 0.15 mm or more is often employed in order to withstand current application. Therefore, when packaging is performed with the signal processing IC arranged on the IC supporting portion, the thickness of the package increases.

In the current sensor according to Patent Document 1 and Patent Document 2, the magnetoelectric conversion element and the signal processing IC are electrically connected by wires straddling the primary conductor. The wires are longer than wires used in a general IC package, increasing the risk of the wires coming into contact during the molding process. Therefore, in order to make the wires as short as possible, a distance between the IC supporting portion and the primary conductor is preferably designed to be short. However, in an embodiment where the distance between the IC supporting portion and the primary conductor is short, the IC supporting portion is arranged so as to surround the primary conductor, and further, the insulating member exists on a lower surface of the IC supporting portion, there is a concern that embeddability of mold resin becomes poor, and insulation between the primary conductor and the signal processing IC cannot be maintained due to formation of creepage.

Therefore, a first embodiment to third embodiment provides a current sensor for which insulation between the primary conductor and the signal processing IC can be more reliably secured.

Figure 1A:
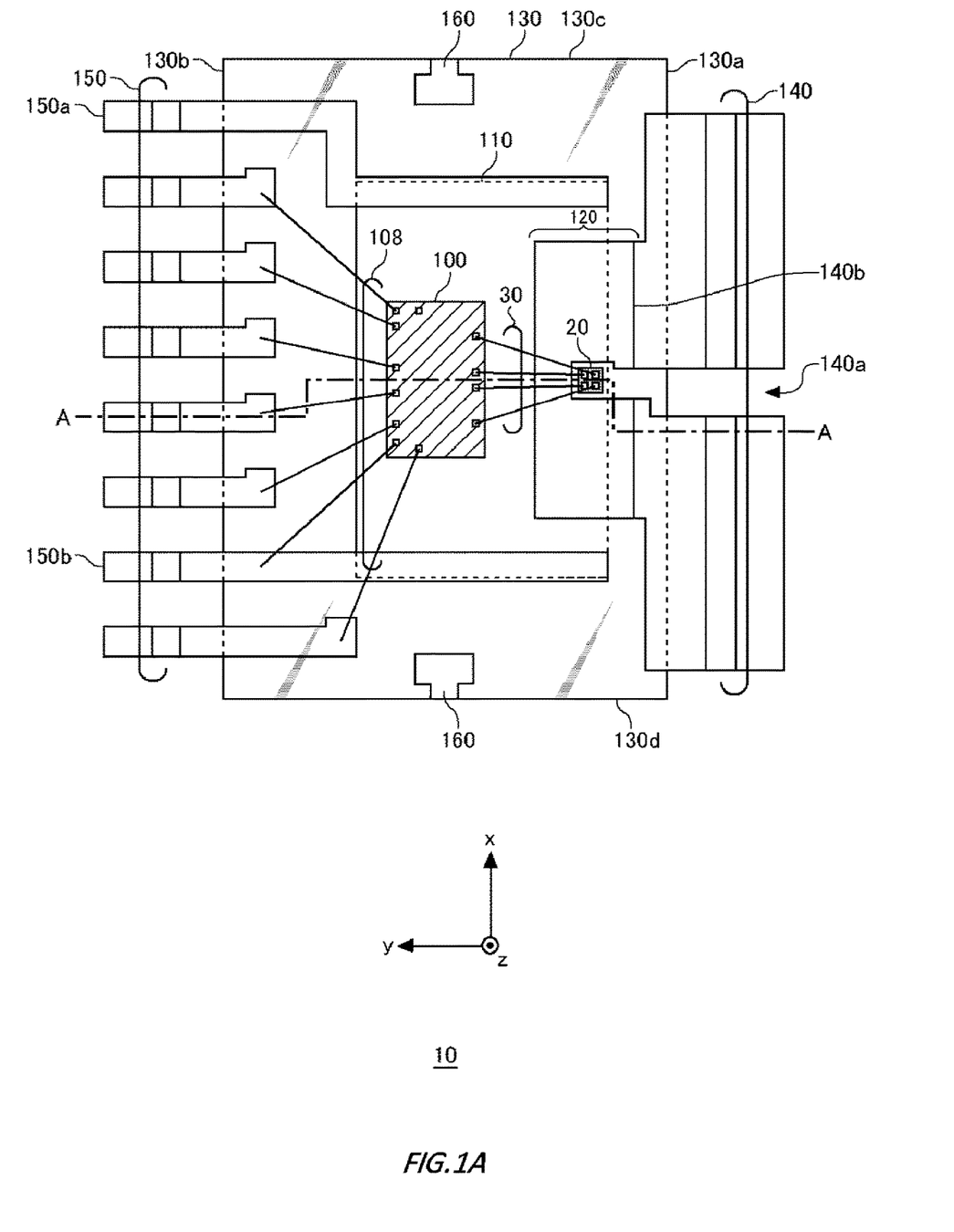
FIG. 1A is a schematic plan view seen from the top side of a current sensor according to a first embodiment.
Figure 1B:
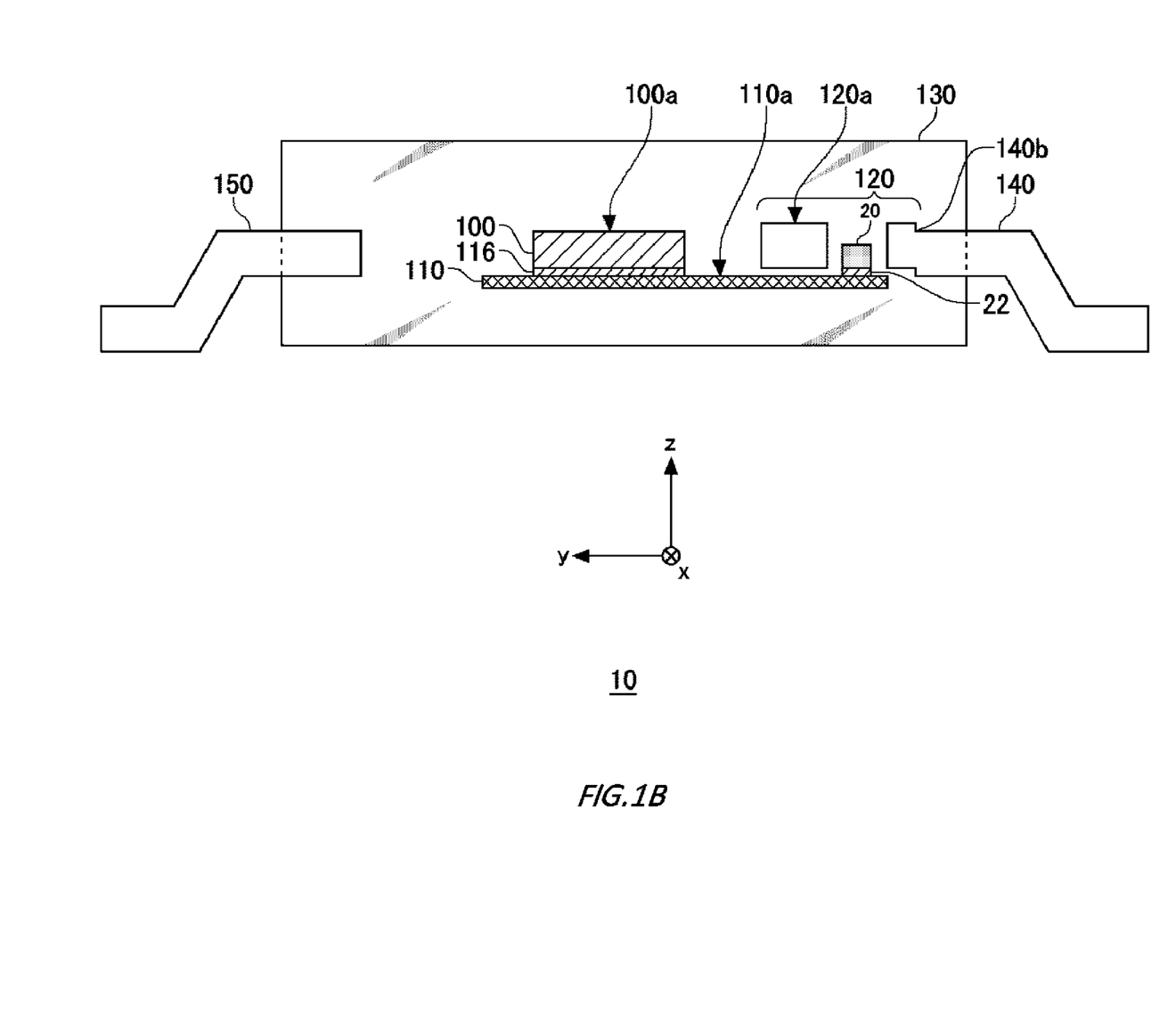
FIG. 1B is an A-A line sectional view of the current sensor shown in FIG. 1A

FIG. 1A and FIG. 1B show the internal configuration of a semiconductor package that serves as a current sensor 10 according to the first embodiment. FIG. 1A is a schematic plan view seen from the top side (Z direction) of the current sensor 10 according to the first embodiment. FIG. 1B is an A-A line sectional view of the current sensor 10 shown in FIG. 1A.

The current sensor 10 includes a signal processing IC 100, a magnetoelectric conversion element 20, a supporting portion 110, a conductor 120, an encapsulating portion 130, a pair of lead terminals 140, a plurality of lead terminals 150, and suspending pins 160. The magnetoelectric conversion element 20 is electrically connected to the signal processing IC 100 via wires 30. The signal processing IC 100 is electrically connected to the plurality of lead terminals 150 via wires 108.

The encapsulating portion 130 encapsulates the magnetoelectric conversion element 20, conductor 120, signal processing IC 100, wires 30, and wires 108 with resin. The resin may be, for example, epoxy-based thermosetting resin with added silica. The pair of lead terminals 140 are primary side lead terminals and an example of a pair of first lead terminals. The plurality of lead terminals 150 is secondary side lead terminals and an example of a plurality of second lead terminals.

For coordinates, in FIG. 1A, an orientation from down to up parallel to a sheet of paper is defined as an X-axis direction, an orientation from right to left parallel to a sheet of paper is defined as a Y-axis direction, and an orientation from far to near perpendicular to a sheet of paper is defined as a Z-axis direction. Any one axis among the X-axis, Y-axis, and the Z-axis is orthogonal to another axis.

The magnetoelectric conversion element 20 detects a magnetic field in a particular direction that changes depending on a measurement current flowing through the conductor 120, and then the signal processing IC 100 amplifies a signal that depends on an intensity of the magnetic field and outputs an amplified signal via the lead terminal 150. The magnetoelectric conversion element 20 may be a chip that is comprised of a compound semiconductor formed on a GaAs substrate and is cut into a square shape or a rectangular shape in the plan view in the Z-axis direction. The magnetoelectric conversion element 20 may have a substrate comprised of a silicon or compound semiconductor and a magnetoelectric convertor provided on the substrate. The thickness of the substrate is adjusted by polishing a surface on a negative Z direction side. The substrate may have a desired thickness in the range of 50 μm to 60 μm. Since a magnetic field in the Z direction is to be detected, a Hall element is appropriate for the magnetoelectric conversion element shown in the drawings. If the magnetoelectric conversion element 20 is arranged in a position where a magnetic field in any one axis direction on a XY plane is detected, for example, if it is arranged in a position where a magnetic field in the X direction is detected, a magnetoresistive element or a flux gate element is appropriate as the magnetoelectric conversion element.

Figure 1C:
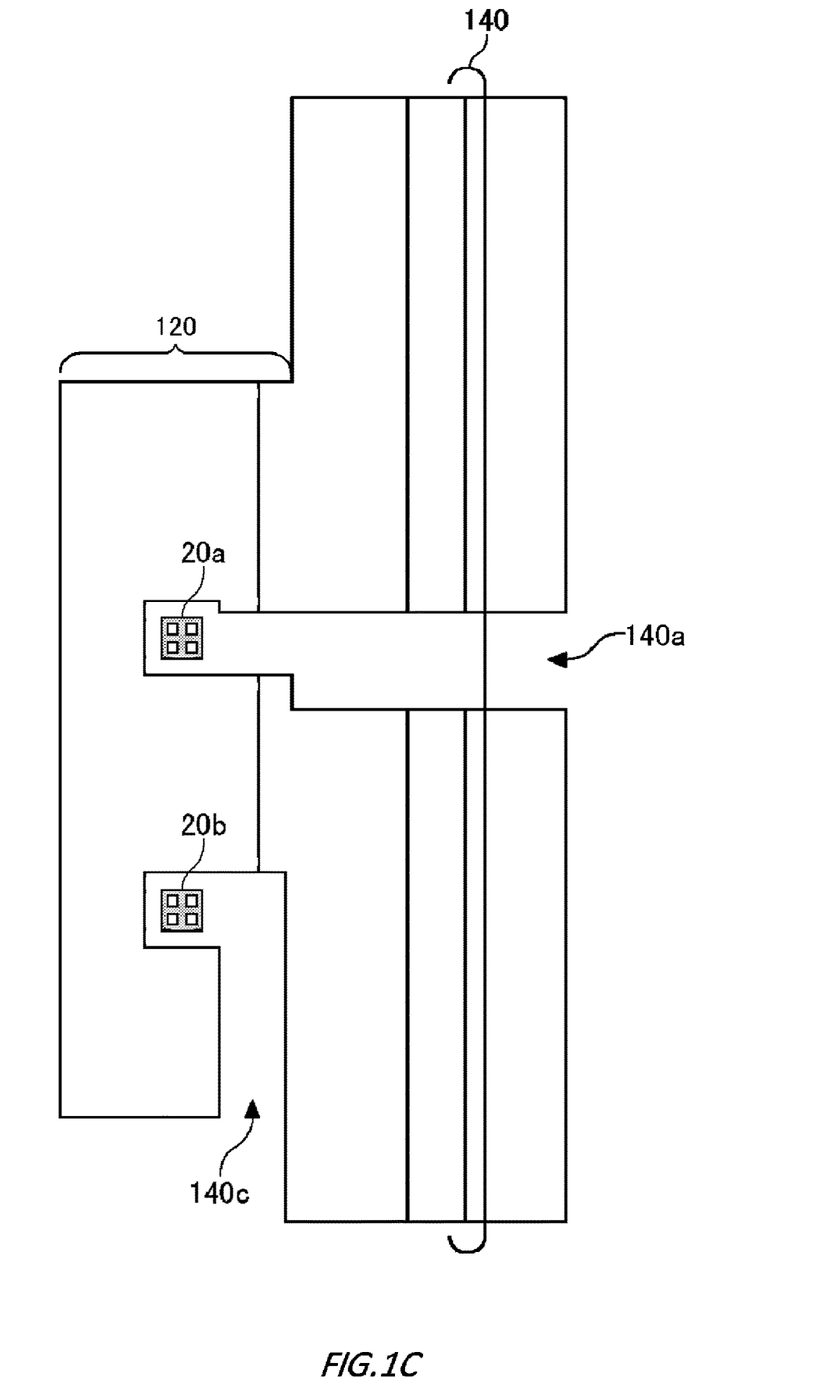
FIG. 1C is a plan view showing an example of a conductor and a lead terminal when the current sensor includes two magnetoelectric conversion elements.

The first embodiment describes an example in which the current sensor 10 includes one magnetoelectric conversion element 20. However, the current sensor 10 may include two or more magnetoelectric conversion elements 20. The conductor 120 may be configured to surround at least a part of each side surface of the plurality of magnetoelectric conversion elements 20. A part of the conductor 120 may be arranged between each of the plurality of magnetoelectric conversion elements 20. When the current sensor 10 includes two magnetoelectric conversion elements, 20a and 20b, the conductor 120 includes, for example, as shown in FIG. 1C, a slit 140a that opens on a side surface 130a side and a slit 140c that opens on a side surface 130d side. The magnetoelectric conversion element 20a may be arranged in the slit 140a, and the magnetoelectric conversion element 20b may be arranged in the slit 140c.

The signal processing IC 100 is a Large-scale Integration circuit (LSI). The signal processing IC 100 is electrically connected to the magnetoelectric conversion element 20 via the wires 30. The signal processing IC 100 is cut into a rectangular shape or a square shape in the plan view. Further, the signal processing IC 100 is electrically connected to at least two lead terminals 150 among the plurality of lead terminals 150 via the wires 108. The wires 30 and the wires 108 may be formed of a conductor material, main components of which are Au, Ag, Cu, or Al. The signal processing IC 100 is a signal processing circuit comprised of a Si monolithic semiconductor formed on an Si substrate. It may be a compound semiconductor substrate instead of the Si substrate. The signal processing circuit processes an output signal that depends on an intensity of a magnetic field output from the magnetoelectric conversion element 20. The signal processing circuit outputs, via the lead terminals 150, an output signal representing a current value of a measurement current flowing through the conductor 120 based on the output signal. The signal processing IC 100 is cut into a rectangular shape or a square shape in a plan view. The thickness of the substrate of the signal processing IC 100 is adjusted by polishing a surface on a negative Z direction side. The substrate has a desired thickness in the range of 50 μm to 600 μm. The signal processing circuit of the signal processing IC 100 includes a circuit that inputs a small output signal depending on the intensity of a magnetic field from the magnetoelectric conversion element 20 and at least amplifies the input signal.

The conductor 120 forms a U-shape in a plan view and at least partially surrounds a side surface of the magnetoelectric conversion element 20, and a measurement current to be measured by the magnetoelectric conversion element 20 flows through. The conductor 120 is electrically connected to the pair of lead terminals 140. The conductor 120 may be configured to be physically integrated with the pair of lead terminals 140. The measurement current is input to one of the pair of lead terminals 140 and is output from another of the lead terminals 140 via the conductor 120. The pair of lead terminals 140 and the conductor 120 may be configured to be integrated with each other through a lead frame of a conductor material, a main component of which is copper. The measurement current to be measured by the magnetoelectric conversion element 20 flows through the pair of lead terminals 140 and the conductor 120. The conductor 120 includes the slit 140a that opens on the side surface 130a side. The magnetoelectric conversion element 20 is arranged in the slit 140a. The measurement current flowing through the conductor 120 flows from one end of the U-shape to the other end. This generates, around the conductor 120, a magnetic field that depends on an intensity of the measurement current and a distance from the conductor 120. The generated magnetic field has a largest Z direction component at the position where the magnetoelectric conversion element 20 is arranged. Since the magnetoelectric conversion element 20 is arranged in the slit 140a, high sensitivity can be achieved for the measurement current.

The pair of lead terminals 140 and the plurality of lead terminals 150 are arranged opposing each other in a direction (Y direction) orthogonal to a thickness direction of the signal processing IC 100 (Z-axis direction) via the signal processing IC 100. The pair of lead terminals 140 is partially exposed on the side surface 130a of the encapsulating portion 130. The plurality of lead terminals 150 is partially exposed on a side surface 130b that is opposite to the side surface 130a of the encapsulating portion 130. The suspending pins 160 are partially exposed on a side surface 130c and the side surface 130d opposing each other in the X direction and different from the side surface 130a and side surface 130b of the encapsulating portion 130. The suspending pins 160 are metal members to support a semiconductor package to a lead frame in the manufacturing phase. The suspending pins 160 are leads to support the encapsulating portion 130 that is formed by a mold resin during an assembly process.

The at least two lead terminals 150 of the plurality of lead terminals 150 are metal members electrically connected to the signal processing IC 100, and the suspending pins 160 are metal members that do not directly take a signal output from the signal processing IC 100 outside. The suspending pins 160 may not be electrically connected to the signal processing IC 100. The suspending pins 160 are separate from the plurality of second lead terminals. The plurality of lead terminals 150 and the suspending pins 160 may be comprised of a lead frame of a conductor material, a main component of which is copper, which are the same as the pair of lead terminals 140 and the conductor 120. The plurality of lead terminals 150 and the suspending pins 160 are separate from the conductor 120 and are electrically insulated from the conductor 120. The lead frame has a desired thickness in the range of 50 µm to 600 µm.

The supporting portion 110 is a plate-like member, supports the magnetoelectric conversion element 20 and the signal processing IC 100 on a surface 110a on the top side of the encapsulating portion 130, and is spaced apart from the conductor 120. The supporting portion 110 is electrically insulated from the conductor 120. The conductor 120 includes a stepped portion 140b in a direction separating from the supporting portion 110 in order to prevent contact with the supporting portion 110. That is, the conductor 120 includes the stepped portion 140b such that the surface 110a of the supporting portion 110 is spaced apart in a thickness direction of the conductor 120 from a surface of the conductor 120 opposing the surface 110a. The stepped portion 140b may be provided on the conductor 120 by a half blanking process so that the supporting portion 110 and the conductor 120 do not come in contact. The stepped portion 140b may be provided on the conductor 120 by a coining process. The magnetoelectric conversion element 20 may be bonded on the surface 110a of the supporting portion 110 via an adhesive layer 22. The signal processing IC 100 may be bonded to the surface 110a of the supporting portion 110 via an adhesive layer 116. The adhesive layer 22 and the adhesive layer 116 may be adhesive tape. The adhesive tape may be tape configured by an epoxy-based resin, a die bond tape having a general adhesive layer, or a die bond tape that also serves as a dicing tape having an adhesive layer.

Figure 1D:
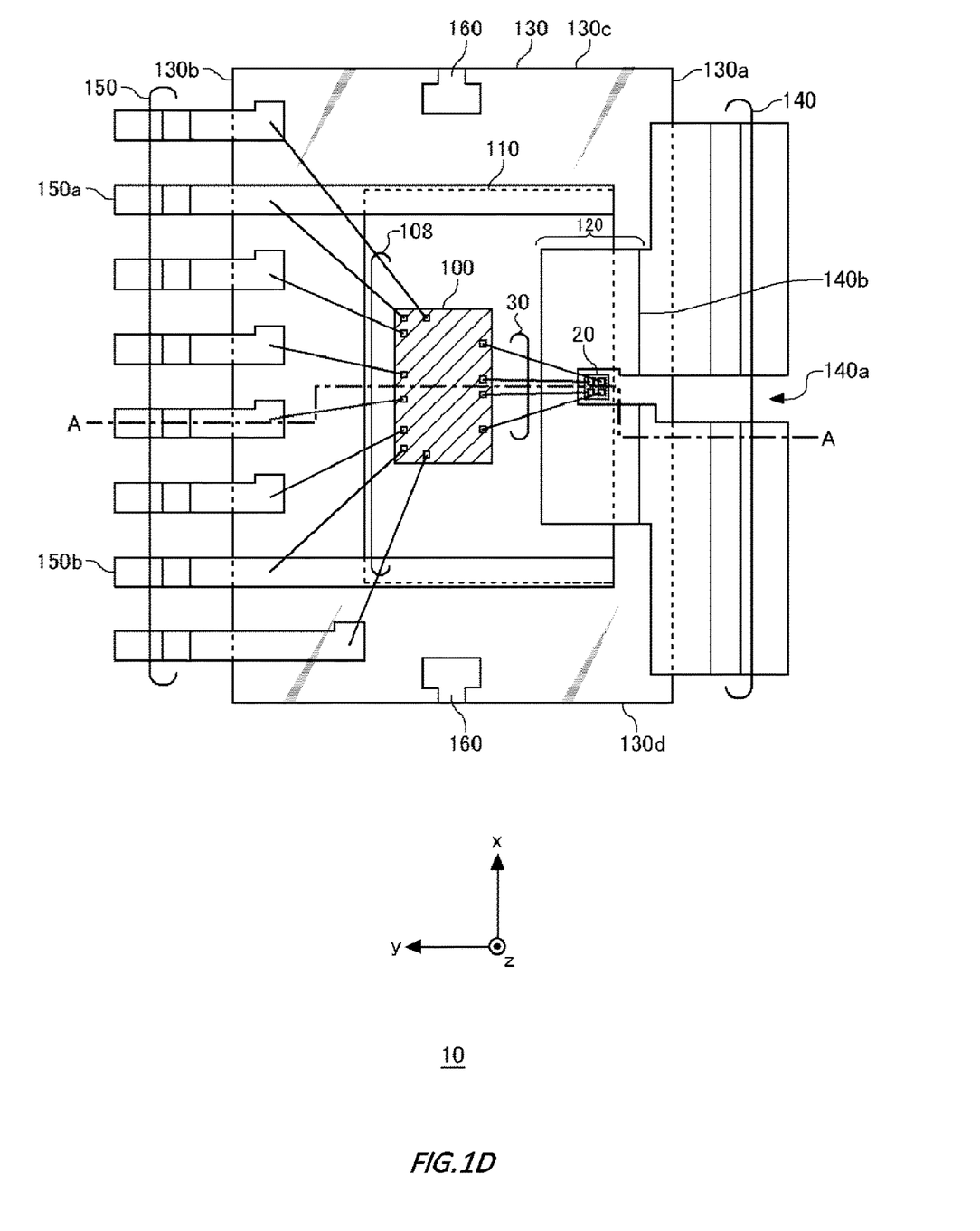
FIG. 1D describes another example of a lead terminal that supports a supporting portion.

The supporting portion 110 further supports two of the plurality of lead terminals 150, lead terminal 150a and lead terminal 150b, on the surface 110a on the top side of the encapsulating portion 130. The lead terminals 150a and 150b may be bonded to the surface 110a of the supporting portion 110 via an adhesive layer, similarly to the magnetoelectric conversion element 20 and the signal processing IC 100. The two lead terminals 150a and 150b extend more to the pair of lead terminals 140 side than the other lead terminals 150. In a plan view (viewed from the Z direction), the signal processing IC 100 and the magnetoelectric conversion element 20 are arranged between the two lead terminals 150a and 150b. The two lead terminal 150a and lead terminal 150b are spaced apart and not electrically connected. Therefore, the assignment of the signal for the lead terminal 150a and the lead terminal 150b can be determined respectively. The two lead terminals 150a and 150b are an example of a metal member supported by the supporting portion 110. In the example shown in FIG. 1A, the lead terminal 150a is positioned on the most side surface 130c side of the encapsulating portion 130, and is not electrically connected to the signal processing IC 100. The lead terminal 150b is positioned on an inner side of the lead terminals 150 on the most side surface 130d side of the encapsulating portion 130, and is electrically connected to the signal processing IC 100. However, the two lead terminals 150a and 150b may be any two lead terminals of the plurality of lead terminals 150. For example, as shown in FIG. 1D, the lead terminal 150a may be positioned on an inner side of the lead terminals 150 on the most side surface 130c side of the encapsulating portion 130, and electrically connected to the signal processing IC 100. The metal member supported by the supporting portion 110 may be the suspending pins 160. Further, the metal member supported by the supporting portion 110 may be both the suspending pins 160 and the lead terminals 150.

An exposure starting part of the lead terminals 140 from the encapsulating portion 130 and an exposure starting part of the lead terminals 150 from the encapsulating portion 130 overlap with the signal processing IC 100 when viewed from the direction orthogonal to the thickness direction of the signal processing IC 100 (Y direction). The exposure starting part of the lead terminals 140 from the encapsulating portion 130 and the exposure starting part of the lead terminals 150 from the encapsulating portion 130 does not overlap with the supporting portion 110 when viewed from the direction orthogonal to the thickness direction of the signal processing IC 100 (Y direction).

The supporting portion 110 may be configured by an insulator or a semiconductor. The coefficient of thermal expansion of the supporting portion 110 may be $1.0 \times 10^{-6}$/K or more and $10 \times 10^{-6}$/K or less at 25° C. That is, 90% or more of material of the supporting portion 110 may be configured by silicon or germanium. Or, the Young's modulus of the supporting portion 110 may be 0.01 GPa or more and 100 GPa or less at 25° C. That is, the supporting portion 110 may be configured by polymeric material. In this manner, the supporting portion 110 may be configured by an insulation or semiconductor member rather than a metal member. Or, even if the Young's modulus is more than 100 Gpa, the thickness of the supporting portion 110 may be less than 0.1 mm.

For example, the supporting portion 110 may be configured by an insulating member with a low elastic modulus such as polymer tape or the like such as polyimide tape or the like. The supporting portion 110 may be configured by a member such as silicon or the like having a similar coefficient of thermal expansion as that of the signal processing IC 100 or the magnetoelectric conversion element 20. The supporting portion 110 may be configured by a member having a thickness less than 0.1 mm. In this way, stress that acts on the signal processing IC 100 by heat change generated within the encapsulating portion 130 can be reduced.

When viewed from a direction orthogonal to the thickness direction of the signal processing IC 100 (X direction or Y direction), a surface 100a that is opposite to the surface of the signal processing IC 100 supported by the surface 110a of the supporting portion 110 does not protrude 0.15 mm or more from a surface 120a of the conductor 120 on the same side as the surface 100a in the thickness direction of the signal processing IC 100. That is, a height of which the surface 100a of the signal processing IC 100 protrudes from the surface 120a of the conductor 120 in the thickness direction of the signal processing IC 100 is less than 0.15 mm. In this way, the signal processing IC 100 does not restrict the height of the package, and a thin package can be achieved.

The wires 30 that electrically connect the signal processing IC 100 and the magnetoelectric conversion element 20 straddle the top of the conductor 120. In order to secure resistance to pressure while also considering variations in processing, the wires 30 must be spaced apart approximately 0.15 mm from the conductor 120. Therefore, if the surface 100a of the signal processing IC 100 does not protrude 0.15 mm or more from the surface 120a of the conductor 120, the signal processing IC 100 does not restrict the height of the package.

Since a height of the signal processing IC 100 in its thickness direction can achieve approximately the same height as that of the lead terminals 140, the package can be made thin. The supporting portion 110 does not surround the conductor 120. Furthermore, a supporting portion which is configured integrally with the lead terminals 150 and which supports the signal processing IC 100 does not exist. Therefore, the package can be made thin, and resin can be embedded easily.

The supporting portion 110 may include a plurality of through holes. In this way, since resin is also embedded in the plurality of through holes, embeddability of the resin can be further improved.

As the above, insulation can be more reliably achieved with a thin package according to the current sensor 10 according to the first embodiment.

Figure 2A:
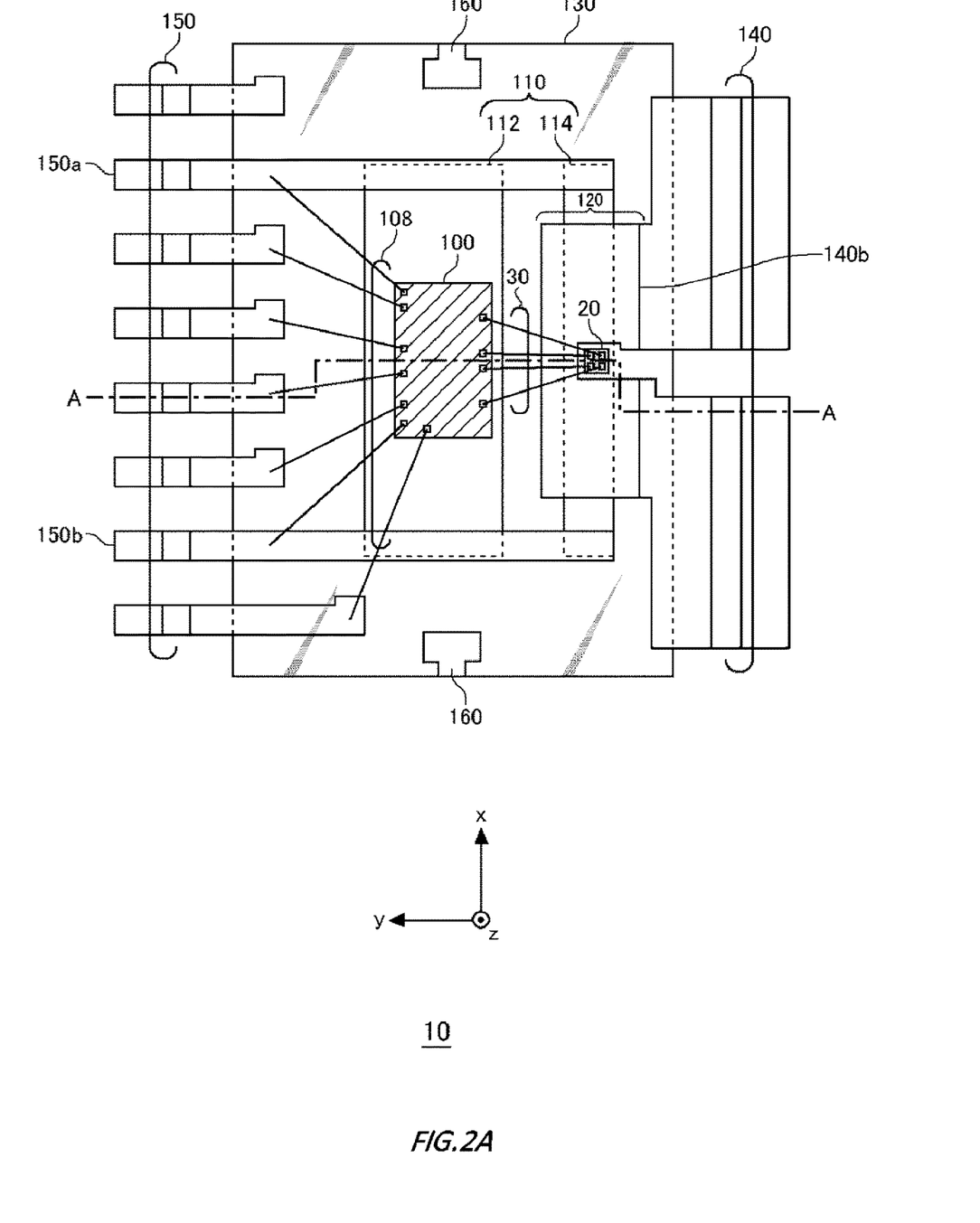
FIG. 2A is a schematic plan view seen from the top side of the current sensor according to a second embodiment.
Figure 2B:
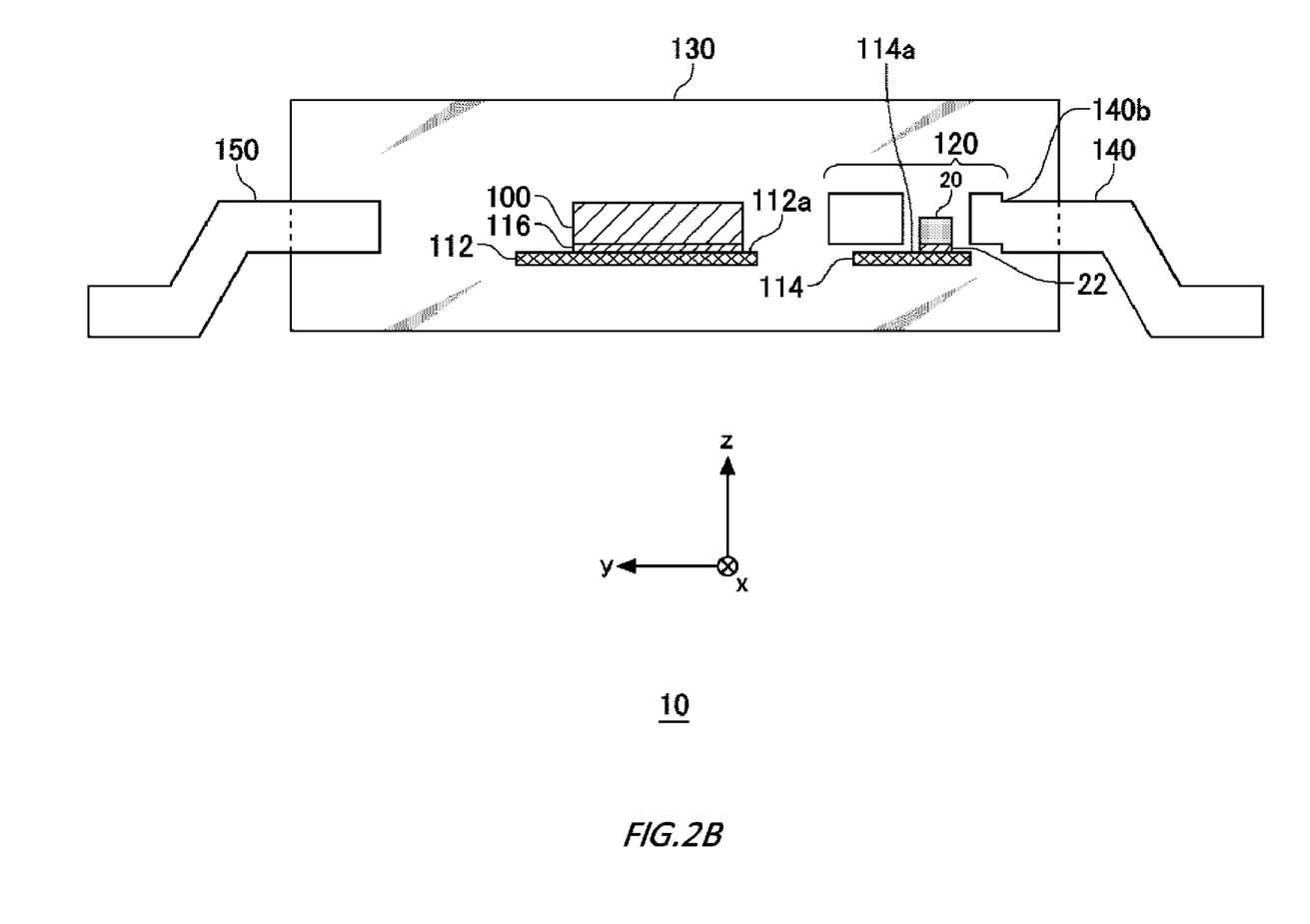
FIG. 2B is an A-A line sectional view of the current sensor shown in FIG. 2A.

FIG. 2A and FIG. 2B show the internal configuration of the semiconductor package that serves as the current sensor 10 according to a second embodiment. FIG. 2A is a schematic plan view seen from the top side (Z direction) of the current sensor 10 according to the second embodiment. FIG. 2B is an A-A line sectional view of the current sensor 10 shown in FIG. 2A.

The current sensor 10 according to the second embodiment is different from the current sensor 10 according to the first embodiment in that the supporting portion 110 includes an IC supporting portion 112 that supports the signal processing IC 100 and an element supporting portion 114 that is separate from the IC supporting portion 112 and supports the magnetoelectric conversion element 20.

The IC supporting portion 112 and the element supporting portion 114 further support the two lead terminals 150a and 150b among the plurality of lead terminals 150 on a first surface including a surface 112a and a surface 114a on the top side of the encapsulating portion 130. The first surface includes the surface 112a of the IC supporting portion 112 and the surface 114a of the element supporting portion 114 that are surfaces on the same side of the IC supporting portion 112 and the element supporting portion 114, and the surface 112a and the surface 114a may be on the same plane, but they do not necessarily have to be on the same plane. The lead terminals 150a and 150b may be bonded to the surface 112a of the IC supporting portion 112 via an adhesive layer similarly to the magnetoelectric conversion element 20 and the signal processing IC 100. The two lead terminals 150a and 150b may be lead terminals further inside than the two lead terminals 150 on both ends among the plurality of lead terminals 150. Among the plurality of lead terminals 150, the lead terminal 150 that supports the IC supporting portion 112 may be any of the lead terminals 150 and may be selected according to a width of the IC supporting portion 112 in the X direction.

When an adhesive area in which the element supporting portion 114 and the lead terminals 150a and 150b are bonded is too small, the element supporting portion 114 is more prone to modification, the position of the magnetoelectric conversion element 20 is shifted due to bending or twisting, and variations of sensitivity among individuals increases. When the adhesive area is too small, a chance that the element supporting portion 114 and the lead terminals 150a and 150b peel off during the manufacturing process increases. Further, a polymer tape such as polyimide tape or the like may be considered to be used as the element supporting portion 114, but processing on a too narrow width is generally difficult. Therefore, considering viability of processing, at least one side of the adhesive area is preferably 0.4 mm or more. That is, a width of the element supporting portion 114 in the Y direction is preferably 0.4 mm or more. Note that one side of the adhesive area is preferably 10 mm or less so as to not protrude from the encapsulating portion 130.

According to the current sensor 10 according to the second embodiment, the IC supporting portion 112 and the element supporting portion 114 that serve as the supporting portion 110 are configured separately, and the IC supporting portion 112 and the element supporting portion 114 are spaced apart. Therefore, resin is also embedded between the IC supporting portion 112 and the element supporting portion 114, and embeddability of the resin is further improved. Therefore, according to the current sensor 10 according to the second embodiment, insulation can be more reliably achieved.

The IC supporting portion 112 and the element supporting portion 114 may be configured by different materials.

Figure 3A:
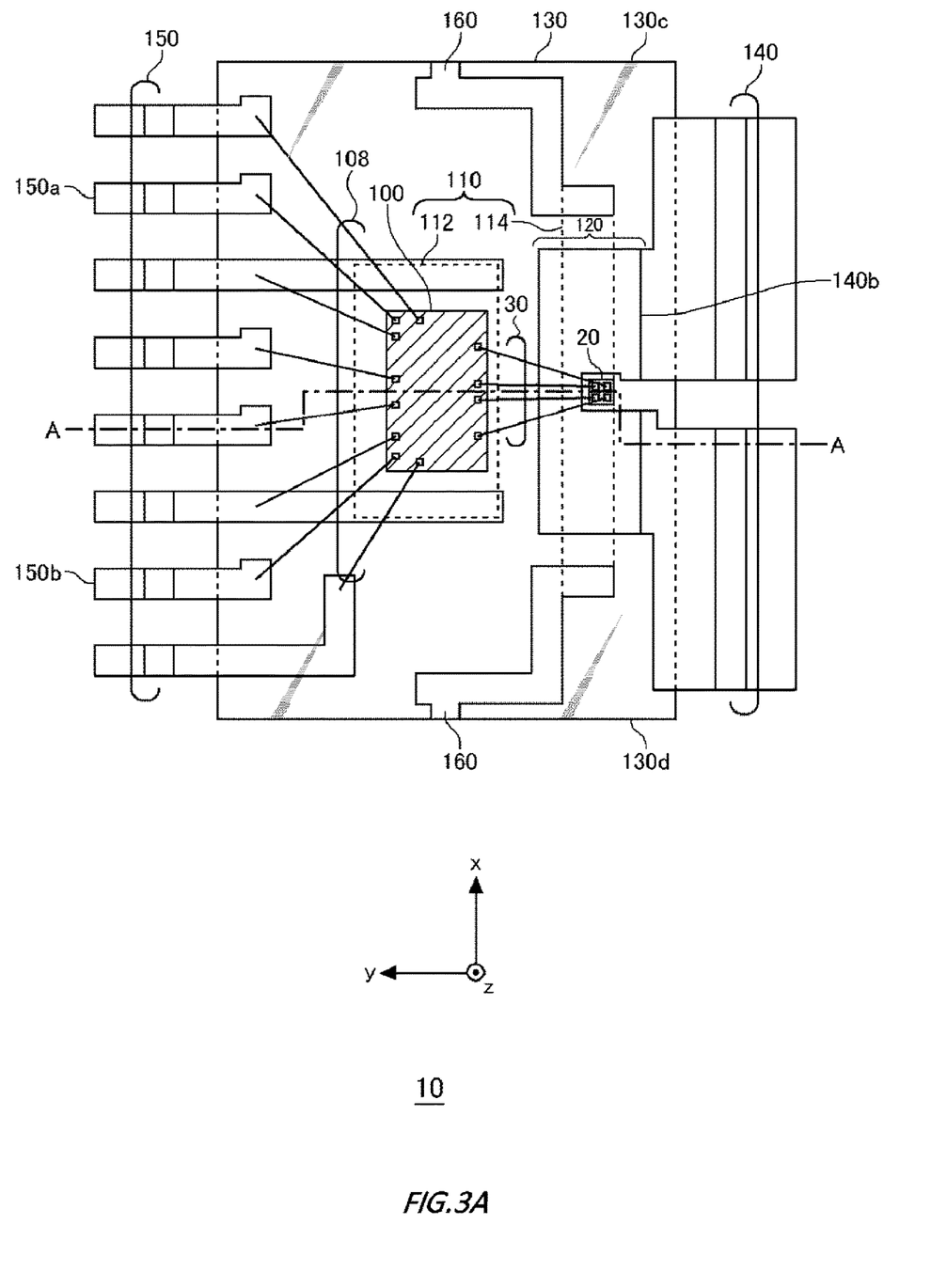
FIG. 3A is a schematic plan view seen from the top side of the current sensor according to a third embodiment.
Figure 3B:
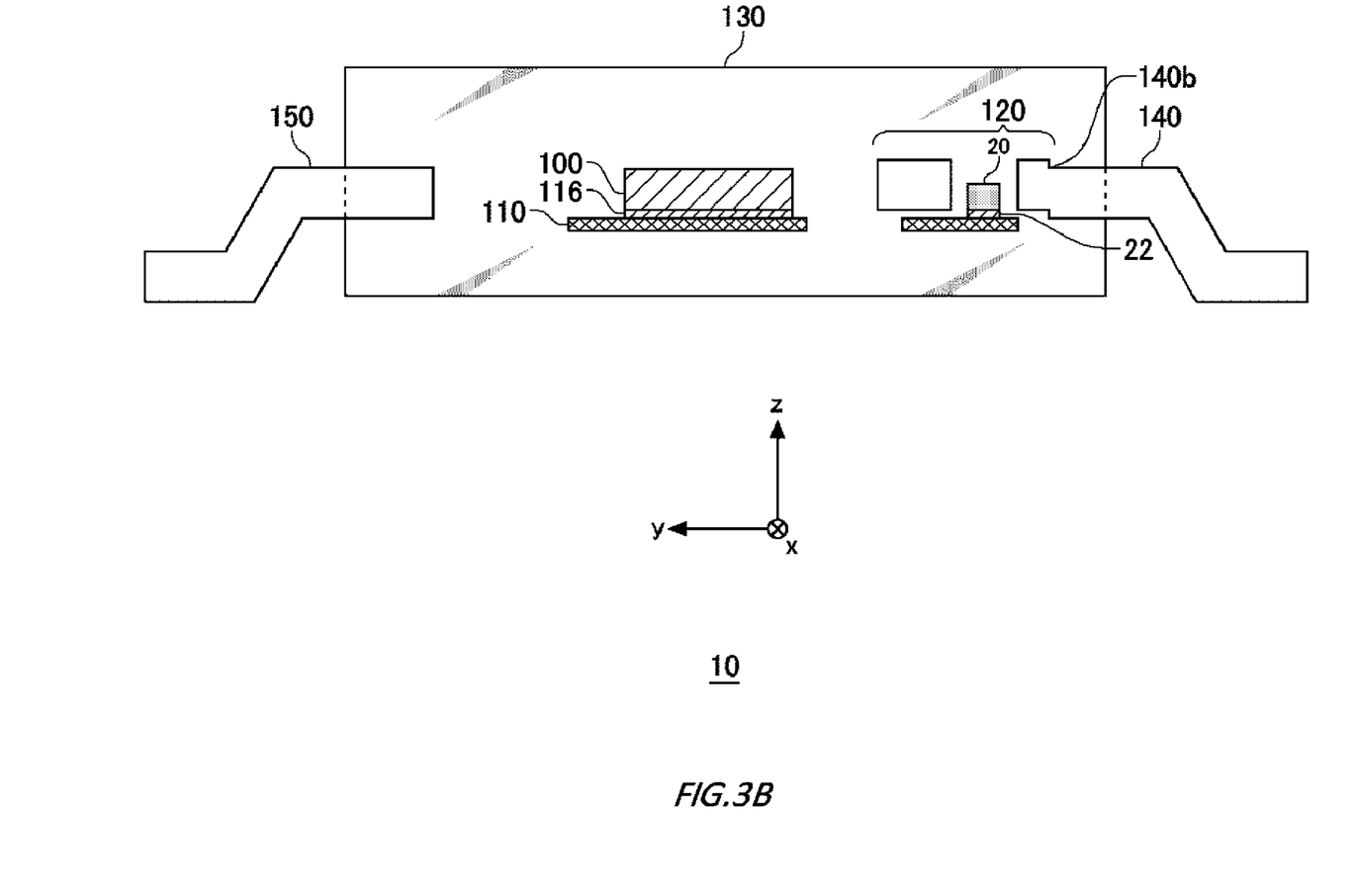
FIG. 3B is an A-A line sectional view of the current sensor shown in FIG. 3A.

FIG. 3A and FIG. 3B show the internal configuration of the semiconductor package that serves as the current sensor 10 according to a third embodiment. FIG. 3A is a schematic plan view seen from the top side (Z direction) of the current sensor 10 according to the third embodiment. FIG. 3B is an A-A line sectional view of the current sensor 10 shown in FIG. 3A.

The current sensor 10 according to the third embodiment is different from the current sensor 10 according to the second embodiment in that the metal members supporting the IC supporting portion 112 are the lead terminals 150a and 150b, but the metal members supporting the element supporting portion 114 are the suspending pins 160. The lead terminals 150a and 150b are an example of a first metal member, and the suspending pins 160 are an example of a second metal member. The suspending pins 160 may hold both the IC supporting portion 112 and the element supporting portion 114.

In the current sensor 10 according to the third embodiment, the suspending pins 160 extend from the side surface 130c and the side surface 130d of the encapsulating portion 130 to a position opposing the conductor 120 toward the magnetoelectric conversion element 20. The suspending pins 160 are spaced apart from the conductor 120 and are electrically insulated from the conductor 120.

When an adhesive area in which the element supporting portion 114 and the suspending pins 160 are bonded is too small, the element supporting portion 114 is more prone to modification, the position of the magnetoelectric conversion element 20 is shifted due to bending or twisting, and variations of sensitivity among individuals increases. When the adhesive area is too small, a chance that the element supporting portion 114 and the suspending pins 160 peel off during the manufacturing process increases. Further, a polymer tape such as polyimide tape or the like may be considered to be used as the element supporting portion 114, but processing on a too narrow width is generally difficult. Therefore, considering viability of processing, at least one side of the adhesive area is preferably 0.4 mm or more. That is, the width of the element supporting portion 114 in the Y direction is preferably 0.4 mm or more.

When adhesive areas on both ends of the IC supporting portion 112 are separated from each other, there is a chance that they twist, the bond with the lead terminals 150 peels off, the position of the signal processing IC 100 changes, and posture of the signal processing IC 100 becomes sloped. In this way, there is concern that stress is more easily applied to the wires 30 that electrically connect the magnetoelectric conversion element 20 and the signal processing IC 100. Therefore, by bringing the lead terminals 150 closer to the signal processing IC 100 and having the IC supporting portion 112 have a length that is not too large with respect to a width of the signal processing IC 100, the IC supporting portion 112 can be prevented from twisting and easily peeled off from its bonds with the lead terminals 150.

The IC supporting portion 112 and the element supporting portion 114 are configured separately, and the IC supporting portion 112 and the element supporting portion 114 are spaced apart. Therefore, resin is also embedded between the IC supporting portion 112 and the element supporting portion 114, and embeddability of the resin is further improved. Therefore, according to the current sensor 10 according to the third embodiment, insulation can be more reliably achieved. Since the IC supporting portion 112 and the element supporting portion 114 are configured separately and the metal member supported by the element supporting portion 114 are the suspending pins 160 that are not electrically connected to the signal processing IC 100, unnecessary noise is less likely to be carried on the lead terminals 150.

As the above, while the present invention has been described by using the embodiments, the technical scope of the present invention is not limited to the range according to the above-described embodiments. It is apparent to persons skilled in the art that various alterations or improvements can be added to the above-described embodiments. It is also apparent from the description of the scope of claims that the embodiments to which such alterations or improvements are made can fall within the technical scope of the present invention.

The operations, procedures, steps, and stages of each process performed by an apparatus, system, program, and method shown in the scope of claims, specification, or drawings can be achieved in any order as long as the order is not indicated by "prior to," "before," or the like and as long as the output from a previous process is not used in a later process. Even if the process flow is described by using phrases such as "first" or "then" in the scope of claims, specification, or drawings, it does not necessarily mean that the process must be performed in this order.

(Item 1)
A current sensor, comprising:
at least one magnetoelectric conversion element;
a conductor that at least partially surrounds the at least one magnetoelectric conversion element in a plan view and through which a measurement current to be measured by the at least one magnetoelectric conversion element flows;
a signal processing IC that processes a signal that is output from the at least one magnetoelectric conversion element;
an encapsulating portion that encapsulates the at least one magnetoelectric conversion element, the conductor, and the signal processing IC;
a pair of first lead terminals that is partially exposed outside of the encapsulating portion, is electrically connected to the conductor, inputs the measurement current to the conductor, and outputs the measurement current from the conductor;
a metal member that is partially exposed outside of the encapsulating portion and is spaced apart from the conductor; and
a supporting portion that supports the at least one magnetoelectric conversion element, the signal processing IC, and the metal member on a first surface, is spaced apart from the conductor, and is separate from the metal member.

(Item 2)
The current sensor according to item 1,
further comprising a plurality of second lead terminals that is partially exposed outside of the encapsulating portion and includes at least one of the plurality of second lead terminals which is electrically connected to the signal processing IC, wherein
the metal member is at least one second lead terminal among the plurality of second lead terminals.

(Item 3)
The current sensor according to item 1,
further comprising a plurality of second lead terminals that is partially exposed outside of the encapsulating portion and includes at least one of the plurality of second lead terminals which is electrically connected to the signal processing IC, wherein
the metal member is separate from the plurality of second lead terminals.

(Item 4)
The current sensor according to item 1,
further comprising a plurality of second lead terminals that is partially exposed outside of the encapsulating portion and includes at least one of the plurality of second lead terminals which is electrically connected to the signal processing IC, wherein
the metal member includes a first metal member that is one second lead terminal among the plurality of second lead terminals, and a second metal member that is separate from the plurality of second lead terminals.

(Item 5)
The current sensor according to item 1, wherein
the supporting portion includes a through hole.

(Item 6)
The current sensor according to item 1, wherein
the conductor includes a stepped portion such that the first surface of the supporting portion is spaced apart in a thickness direction of the conductor from a surface of the conductor opposing the first surface.

(Item 7)
The current sensor according to any one of items 1 to 6, wherein
a Young's modulus of the supporting portion is 100 GPa or less, a thickness of the supporting portion is less than 0.1 mm, or a coefficient of thermal expansion of the supporting portion is $10 \times 10^{-6}$/K or less.

(Item 8)

The current sensor according to any one of items 1 to 6, wherein the supporting portion is configured by an insulator or a semiconductor.

(Item 9)

The current sensor according to any one of items 1 to 6, wherein
the supporting portion is configured by a polymeric material or alternatively 90% or more of a material of the supporting portion is configured by silicon or germanium.

(Item 10)

The current sensor according to any one of items 1 to 6, wherein
when viewed from a first direction orthogonal to a thickness direction of the signal processing IC, a surface that is opposite to a surface of the signal processing IC that is supported by the first surface of the supporting portion does not protrude 0.15 mm or more from a surface of the conductor on a side identical to the first surface.

(Item 11)

The current sensor according to any one of items 2 to 4, wherein the supporting portion includes:
an IC supporting portion that supports the signal processing IC and the metal member on the first surface, and
an element supporting portion that is separate from the IC supporting portion and supports the at least one magnetoelectric conversion element and the metal member on the first surface.

(Item 12)

The current sensor according to item 11, wherein
the pair of first lead terminals and the plurality of second lead terminals are arranged opposing each other in a first direction orthogonal to a thickness direction of the signal processing IC via the signal processing IC, and
a width of the element supporting portion in the first direction is 0.4 mm or more.

(Item 13)

The current sensor according to any one of items 2 to 4, wherein
the pair of first lead terminals and the plurality of second lead terminals are arranged opposing each other in a first direction orthogonal to a thickness direction of the signal processing IC via the signal processing IC, and
a width of the element supporting portion in the first direction is 0.4 mm or more.

(Item 14)

The current sensor according to item 11, wherein
the pair of first lead terminals and the plurality of second lead terminals are arranged opposing each other in a first direction orthogonal to a thickness direction of the signal processing IC via the signal processing IC, and
the IC supporting portion and the element supporting portion are spaced apart in the first direction.

EXPLANATION OF REFERENCES

10: current sensor, 20: magnetoelectric conversion element, 22, 116: adhesive layer, 30, 108: wire, 100: signal processing IC, 110: supporting portion, 112: IC supporting portion, 114: element supporting portion, 120: conductor, 130: encapsulating portion, 130a, 130b, 130c, 130d: side surface, 140: lead terminal, 140a: slit, 150, 150a, 150b: lead terminal, 160: suspending pin.

What is claimed is:

1. A current sensor, comprising:
at least one magnetoelectric conversion element;
a conductor that at least partially surrounds the at least one magnetoelectric conversion element in a plan view and through which a measurement current to be measured by the at least one magnetoelectric conversion element flows;
a signal processing IC that processes a signal that is output from the at least one magnetoelectric conversion element;
an encapsulating portion that encapsulates the at least one magnetoelectric conversion element, the conductor, and the signal processing IC;
a pair of first lead terminals that is partially exposed outside of the encapsulating portion, is electrically connected to the conductor, inputs the measurement current to the conductor, and outputs the measurement current from the conductor;
a metal member that is partially exposed outside of the encapsulating portion and is spaced apart from the conductor;
a supporting portion that supports the at least one magnetoelectric conversion element, the signal processing IC, and the metal member on a first surface, is spaced apart from the conductor, and is separate from the metal member; and
a plurality of second lead terminals that is partially exposed outside of the encapsulating portion, wherein at least one of the plurality of second lead terminals is electrically connected to the signal processing IC, wherein
the metal member is at least one second lead terminal among the plurality of second lead terminals, and
the metal member and the conductor do not overlap with the signal processing IC in the plan view,
the pair of first lead terminals and the plurality of second lead terminals are arranged opposing each other, via the signal processing IC, in a first direction orthogonal to a thickness direction of the signal processing IC, and
the supporting portion is configured by an insulator or a semiconductor.

2. The current sensor according to claim 1, wherein
the metal member includes a first metal member that is one second lead terminal among the plurality of second lead terminals, and a second metal member that is separate from the plurality of second lead terminals.

3. The current sensor according to claim 1, wherein
the metal member includes a first metal member and a second metal member,
the first metal member and the second metal member are spaced apart in a second direction that is orthogonal to the thickness direction of the signal processing IC and the first direction, and
among two end portions of the supporting portion opposing each other in the second direction, one end portion of the supporting portion supports the first metal member and another end portion of the supporting portion supports the second metal member.

4. The current sensor according to claim 3, wherein
the first metal member is one second lead terminal among the plurality of second lead terminals, and
the second metal member is one second lead terminal among the plurality of second lead terminals.

5. The current sensor according to claim 1, wherein
the supporting portion includes a through hole.

6. The current sensor according to claim 1, wherein
the conductor includes a stepped portion such that the first surface of the supporting portion is spaced apart in a thickness direction of the conductor from a surface of the conductor opposing the first surface.

7. The current sensor according to claim 1, wherein a Young's modulus of the supporting portion is 100 GPa or less, a thickness of the supporting portion is less than 0.1 mm, or a coefficient of thermal expansion of the supporting portion is $10 \times 10^{-6}$/K or less.

8. The current sensor according to claim 1, wherein the supporting portion is configured by a polymeric material or alternatively 90% or more of a material of the supporting portion is configured by silicon or germanium.

9. The current sensor according to claim 1, wherein when viewed from the first direction orthogonal to the thickness direction of the signal processing IC, a surface that is opposite to a surface of the signal processing IC that is supported by the first surface of the supporting portion does not protrude 0.15 mm or more from a surface of the conductor on a side identical to the first surface.

10. The current sensor according to claim 1, wherein the supporting portion includes:
   an IC supporting portion that supports the signal processing IC and the metal member on the first surface; and
   an element supporting portion that is separate from the IC supporting portion and supports the at least one magnetoelectric conversion element and the metal member on the first surface.

11. The current sensor according to claim 10, wherein a width of the element supporting portion in the first direction is 0.4 mm or more.

12. The current sensor according to claim 10, wherein the IC supporting portion and the element supporting portion are spaced apart in the first direction.

13. The current sensor according to claim 1, wherein a width of the supporting portion in the first direction is 0.4 mm or more.

* * * * *